United States Patent
Askarpour et al.

(10) Patent No.: US 10,139,233 B2
(45) Date of Patent: *Nov. 27, 2018

(54) METHOD AND SYSTEM FOR COMPENSATING FOR SOFT IRON MAGNETIC DISTURBANCES IN MULTIPLE HEADING REFERENCE SYSTEMS

(71) Applicant: Innovative Solutions & Support, Inc., Exton, PA (US)

(72) Inventors: Shahram Askarpour, Media, PA (US); Geoffrey S. M. Hedrick, Malvern, PA (US)

(73) Assignee: Innovative Solutions & Support, Inc., Exton, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/592,068

(22) Filed: May 10, 2017

(65) Prior Publication Data

US 2017/0241783 A1    Aug. 24, 2017

Related U.S. Application Data

(60) Continuation of application No. 15/223,953, filed on Jul. 29, 2016, now Pat. No. 9,677,889, which is a
(Continued)

(51) Int. Cl.
*G01C 21/18* (2006.01)
*G01R 33/00* (2006.01)
(Continued)

(52) U.S. Cl.
CPC ............ *G01C 21/18* (2013.01); *G01C 17/38* (2013.01); *G01C 19/36* (2013.01); *G01C 21/20* (2013.01);
(Continued)

(58) Field of Classification Search
None
See application file for complete search history.

(56) References Cited

U.S. PATENT DOCUMENTS

| 4,005,358 A | 1/1977 | Foner |
| 4,414,753 A | 11/1983 | Moulin et al. |
| | (Continued) | |

FOREIGN PATENT DOCUMENTS

| EP | 2677275 A2 | 12/2013 |
| JP | 62160317 | 10/1987 |
| | (Continued) | |

*Primary Examiner* — Mussa A Shaawat
*Assistant Examiner* — Michael F Whalen
(74) *Attorney, Agent, or Firm* — Bryan Cave Leighton Paisner LLP (57) ABSTRACT

A method and system for compensating for soft iron magnetic disturbances in multiple heading reference systems, such as aircraft heading reference systems, integrated standby units; or vehicle inertial systems, detects and provides a heading correction signal to the error prone heading reference system when a detected difference in value between a gyro heading relative to magnetic north and a magnetometer reading during a defined measurement period exceeds a predetermined acceptable threshold value of change, such as one based on the expected gyro drift over that period. Upon receipt of the heading correction signal, the gyro heading is adjusted to maintain an accurate heading relative to true magnetic north. If this threshold value is not exceeded, then the magnetometer reading is used for the heading value. This method is periodically repeated in order to continually maintain an accurate heading and may be employed for each heading measurement axis.

20 Claims, 6 Drawing Sheets

Related U.S. Application Data continuation-in-part of application No. 14/928,715, filed on Oct. 30, 2015, now Pat. No. 9,658,064, which is a division of application No. 13/529,894, filed on Jun. 21, 2012, now Pat. No. 9,207,079.

(51) Int. Cl.
| | |
|---|---|
| *G01R 33/02* | (2006.01) |
| *G01C 21/20* | (2006.01) |
| *G08G 5/00* | (2006.01) |
| *G01C 17/38* | (2006.01) |
| *G01C 19/36* | (2006.01) |
| *G01C 23/00* | (2006.01) |

(52) U.S. Cl.
CPC ......... *G01C 23/00* (2013.01); *G01R 33/0017* (2013.01); *G01R 33/0206* (2013.01); *G08G 5/0047* (2013.01)

(56) References Cited

U.S. PATENT DOCUMENTS

| | | | |
|---|---|---|---|
| 4,733,179 A | 3/1988 | Bauer et al. | |
| 4,843,865 A | 7/1989 | Fowler | |
| 5,321,631 A | 6/1994 | Germanetti | |
| 5,682,335 A | 10/1997 | Assous et al. | |
| 5,737,226 A | 4/1998 | Olson et al. | |
| 5,878,370 A | 3/1999 | Olson | |
| 5,990,679 A | 5/1999 | Frommer et al. | |
| 6,415,223 B1 | 7/2002 | Lin et al. | |
| 6,459,990 B1 | 10/2002 | McCall et al. | |
| 6,477,465 B1 | 11/2002 | McCall et al. | |
| 6,860,023 B2 | 3/2005 | Manfred et al. | |
| 7,146,740 B2 | 12/2006 | Manfred | |
| 7,162,367 B2 | 1/2007 | Lin et al. | |
| 7,587,277 B1 | 9/2009 | Wells | |
| 8,108,171 B2 | 1/2012 | Judd | |
| 8,275,544 B1 | 9/2012 | Wells et al. | |
| 9,207,079 B2 | 12/2015 | Askarpour | |
| 9,658,064 B2 | 5/2017 | Askapour | |
| 9,677,889 B2 | 6/2017 | Askapour | |
| 2003/0018430 A1* | 1/2003 | Ladetto | G01C 21/16 701/472 |
| 2003/0135327 A1 | 7/2003 | Levine et al. | |
| 2012/0062223 A1* | 3/2012 | Olsson | G01R 33/10 324/252 |
| 2013/0110450 A1 | 5/2013 | Kulik | |
| 2014/0278183 A1 | 9/2014 | Zheng et al. | |
| 2015/0149104 A1* | 5/2015 | Baker | G01R 33/0035 702/87 |
| 2015/0377602 A1 | 12/2015 | Daniel et al. | |
| 2016/0187134 A1* | 6/2016 | Kimishima | G01C 17/28 33/356 |
| 2016/0187142 A1* | 6/2016 | Larsen | G01C 21/18 701/505 |
| 2016/0187155 A1* | 6/2016 | Askarpour | G01C 25/00 701/33.1 |
| 2017/0074660 A1* | 3/2017 | Gann | G01C 21/18 |
| 2017/0075020 A1* | 3/2017 | Gann | G01V 3/16 |
| 2017/0219346 A1 | 8/2017 | Askarpour | |
| 2017/0241783 A1 | 8/2017 | Askarpour et al. | |

FOREIGN PATENT DOCUMENTS

| | | |
|---|---|---|
| JP | 62-160317 U1 | 12/1987 |
| JP | 2002090150 A1 | 3/2002 |
| JP | 2014006248 A1 | 1/2014 |
| KR | 10-2013-0143498 A1 | 12/2013 |

\* cited by examiner

METHOD AND SYSTEM FOR COMPENSATING FOR SOFT IRON MAGNETIC DISTURBANCES IN MULTIPLE HEADING REFERENCE SYSTEMS

CROSS-REFERENCE TO RELATED APPLICATIONS

The present application claims the benefit of and is a continuation of U.S. patent application Ser. No. 15/223,953 filed on Jul. 29, 2016, which is a continuation-in-part of U.S. patent application Ser. No. 14/928,715 filed on Oct. 30, 2015, which is a divisional of U.S. patent application Ser. No. 13/529,894 filed Jun. 21, 2012 (now, U.S. Pat. No. 9,207,079). The contents of the above-identified applications are incorporated by reference in their entireties as if recited in full herein.

FIELD OF THE INVENTION

The present invention relates to heading reference systems and particularly to such systems in which magnetic disturbances due to the presence of local soft iron effects can result in errors in magnetic heading determinations which affect the provision of a heading relative to magnetic north.

BACKGROUND OF THE INVENTION

Traditionally in heading reference systems used for providing a heading relative to magnetic north, such as Attitude and Heading Reference Systems, Air Data and Attitude Heading Reference Systems, Inertial Navigation Systems, or Integrated Standby Systems of the type conventionally employed in aircraft, the heading gyro is periodically corrected by means of data from an external magnetometer that relies on the earth's magnetic field to provide a heading relative to magnetic north. However, the accuracy of such readings can significantly be affected by the presence of local soft iron, such as from local electric circuits on board the aircraft, resulting in meaningful errors in the calculation and ultimate display of the magnetic heading relative to true magnetic north. This can result in serious problems, such as with respect to the proper guidance of the aircraft along its designated flight path. Because of the seriousness of this problem, as well as the desire for a cost effective and efficient solution various attempts have been made to try and avoid these effects which, while helpful, have not totally achieved the objective. One such prior art attempt to try and avoid the effects of the local presence of soft iron which provides these undesirable magnetic disturbances, has involved carefully locating the external magnetometers in aircraft areas where there are minimal local magnetic disturbances present; however, this approach has not proved to be sufficiently cost effective and efficient since it involves locating the external magnetometers on the aircraft wings away from the other electrical devices which can cause such soft iron magnetic disturbances. Such an approach introduces a significant cost due to the presence of such factors as increased installation costs as well as the increased cost of additional units.

In addition, although the use of multiple reference systems installed at different locations of a vehicle can alleviate some of the soft iron effects by providing redundancy through the ability to obtain supplemental heading measurements, it remains a highly costly solution in terms of installation and maintenance. Furthermore, such multiple reference systems commonly operate independently and typically disable the unit that is exhibiting erroneous measurements due to magnetic disturbances instead of compensating by taking into account the measurements of the remaining systems.

This problem of soft iron magnetic disturbances affecting the provision of a correct heading relative to magnetic north while significant with respect to aircraft guidance is not limited to aircraft instruments and is important as well in the guidance of other vehicles which utilize heading reference systems for guidance. Thus, the same problem can occur in any vehicle and any inertial system that normally requires a source of heading that can be subject to variations as a result of local electric/magnetic field changes. Consequently, it is believed that the present invention is applicable to any magnetic heading indication system where disturbances of local soft iron can result in errors in magnetic heading determinations.

Prior art attempts at solving such problems, in applicant's view, are not as efficient or cost effective as the claimed invention and, thus, have not adequately solved the problem. Examples of other such prior art attempts, which applicant believes do not satisfactorily solve the problem, are described, by way of example, in U.S. Pat. No. 4,414,753, entitled "Process for Compensating the Magnetic Disturbances In The Determination of a Magnetic Heading and Devices for Carrying Out This Process"; U.S. Pat. No. 5,737,226, entitled "Vehicle Compass System With Automatic Calibration"; and U.S. Pat. No. 5,878,370, entitled "Vehicle Compass System With Variable Resolution". Other prior art attempts at compensating for errors in the measurement of magnetometers, which applicant also believes do not satisfactorily solve the problem presented here, are described, by way of example in U.S. Pat. No. 5,682,335, entitled "Method and Device for Simultaneous Identification and Correction of Errors in the Measurements of a Magnetometer"; U.S. Pat. No. 7,146,740, entitled "Methods and Apparatus for Automatic Magnetic Compensation"; U.S. Pat. No. 6,860,023, entitled "Methods and Apparatus for Automatic Magnetic Compensation"; U.S. Pat. No. 5,990,679, entitled "Method Using Corrective Factors for Determining a Magnetic Gradient"; U.S. Pat. No. 5,321,631, entitled "Method and Self-Contained System for Harmonizing Equipments On Board a Vehicle Using Means of Measuring the Earth's Gravitational and Magnetic Fields"; U.S. Pat. No. 4,843,865, entitled "Method of Calibrating a Compass Heading"; U.S. Pat. No. 4,733,179, entitled "Method of Determining an Interference-Magnetic Field in a Motor Vehicle Provided with an Electronic Compass"; and U.S. Pat. No. 4,005,358, entitled "Magnetometer with Out-of-Phase Correction".

Thus, it is believed that there is a need for an efficient and cost effective solution for avoiding the effects of local soft iron on magnetic heading calculations in magnetic heading reference systems whether in an aircraft or any other vehicle employing such a system for proper guidance.

SUMMARY OF PARTICULAR EMBODIMENTS OF THE INVENTION

The present invention is directed to systems and methods that compensate for the effects of local soft iron disturbances on magnetic heading calculations in heading reference systems in order to obtain accurate and reliable heading information. Vehicle navigation requires accurate and consistent computation of heading information relative to magnetic north. This is accomplished using sensor instruments such as magnetometers, gyroscopes and accelerometers that are commonly installed in the vehicle as part of one or more heading reference systems. In some embodiments, the sensor instruments are capable of obtaining measurements for each measurement axis (e.g., tri-axial sensors). In addition, these instruments are inherently susceptible to errors (e.g., gyro drift, hard and/or soft iron disturbances in magnetometers) and thus are periodically calibrated to provide corrected heading measurements by computing heading correction signals. In accordance with some embodiments, such calibration is performed by detecting changes in the internal magnetometer and gyro readings of a single attitude and heading reference system during a detection period and determining whether the changes exceed certain thresholds associated with the sensors (e.g., gyro drift). In some embodiments, multiple heading reference systems installed at different locations of the vehicle can be used to detect and determine erroneous magnetometer readings due to soft iron disturbances at that specific location within the vehicle allowing for a corrected heading. In some embodiments, providing corrected heading measurements by calibrating the magnetometers and gyroscopes installed at a specific location within the vehicle is performed by detecting changes in the heading measurements during a detection period and determining whether the changes exceed certain thresholds associated with the sensors (e.g., gyro drift).

In some embodiments, the present invention provides systems and methods for compensating for soft iron magnetic disturbances in a heading reference system by detecting changes both in the magnetometer reading due to the presence of any soft iron magnetic disturbances and the gyro heading relative to magnetic north during a detection period, and then comparing the difference in these detected changes against a predetermined acceptable threshold value in order to determine if this difference exceeds the predetermined acceptable threshold value. If this difference exceeds the predetermined acceptable threshold value, then a heading correction signal is provided for enabling adjustment of the gyro heading in order to maintain true north in the face of the detected soft iron magnetic disturbances. If this difference does not exceed the predetermined acceptable threshold value, then the magnetometer reading is used for the heading value. The predetermined acceptable threshold value is based on the expected gyro drift over the measurement period, with the comparison of the difference in the detected values being based on whether this difference exceeds the expected gyro drift over the measurement period since the immediately previous reading. These steps are iteratively repeated over subsequent measurement periods in order to continue to maintain true magnetic north in the face of any significant soft iron magnetic disturbances.

Various compensation algorithms may be employed for various systems in accordance with the present invention, from a relatively simplistic algorithm which periodically compares the change in the magnetic heading as measured by the magnetometers against the change in heading measured by the rate sensors to much more complex approaches in which the rates of change of the magnetometers and rate sensors for each axis are compared. Typically, in accordance with the present invention, if the change is greater than the expected drift error of the rate sensors, it is assumed that the magnetometer is being affected by a local change in magnetic field and the rate sensor data is used to compensate for effects of the change in the local magnetic field.

In some embodiments, the present invention provides systems and methods for identifying and correcting localized soft iron disturbances within a vehicle using multiple heading reference systems. Specifically, soft iron effects that impact the accuracy of a heading reference system's internal magnetometers are the result of the presence of local electrical circuits within the vehicle and are thus dependent on the installation location. In some embodiments, two or more heading reference systems can be installed at different locations within a vehicle. For example, a heading reference system can be installed in a location within an aircraft that services the pilot and another heading and reference system can be installed in a different location that facilitates operation of the vehicle by the co-pilot. In such cases, techniques are employed that provide for the periodic calibration of the magnetometers for the effects of soft iron and also allow for the correction of the gyroscopes by compensating for the inherent gyro drift.

Such calibration is accomplished by periodically obtaining measurements of the magnetic field from the two or more heading and reference systems' magnetometers that are installed in the different locations within the vehicle and subsequently comparing the changes to determine if they are uniform across the different locations. If the changes in the measured magnetic field are consistent across the different locations in the vehicle then the magnetometers are not exhibiting any soft iron disturbances and their readings can be used to provide accurate heading measurements and also periodically calibrate the respective gyroscopes to account for the inherent gyro drift. If, however, the readings from the magnetometers in one of the heading and reference systems are significantly different from the readings in the other, then that serves as an indicator that the internal magnetometers of at least one heading and reference system may be affected from soft iron disturbances.

In some embodiments, a further determination can be made in order to identify the heading and reference system that is providing inaccurate measurements and whose internal magnetometers are exposed to soft iron disturbances and need to be calibrated. Such determination can be accomplished by calculating the expected heading from the internal magnetometers and gyroscopes and if the heading measurements differ more than a pre-determined threshold then the heading measurement calculated by the internal magnetometers is affected by soft iron disturbances and the internal magnetometers can be calibrated using the gyroscope measurements. However, if the obtained heading measurements do not exceed the pre-determined threshold then the magnetometers are determined to be providing accurate measurements and can be used to calibrate the gyroscope and account for the presence of gyro drift. In addition, the initial indicator may provide information on transient signals within the vehicle or identify any possible environmental factors that can impact the local magnetic field (e.g., weather).

In some embodiments, if the difference of the changes in the magnetometer readings during a detection period between two or more heading reference systems is greater than a pre-defined threshold, and in addition the changes in the magnetometer readings during the same detection period are greater than the expected gyro drift for the gyroscopes in each of the heading and reference systems respectively, then the magnetometer readings are updated using the gyro measurements and calibrated using the updated measurements in order to obtain an accurate heading measurement.

The above methods and systems of the present invention may be employed to improve the compensation of any magnetic indication heading reference system for the presence of soft iron magnetic disturbances which can result in errors in magnetic heading determinations, such as in aircraft systems, such as integrated standby units or other aircraft systems employing heading reference systems, as well as in any vehicle or inertial system that requires a source of heading that may be subject to significant variations as a result of local electric/magnetic field changes. Such systems may be employed as primary or secondary systems and, if desired, may utilize a Kalman filter to blend the gyro measurement with the magnetometer measurement, with the acceptable difference being dependent on the gyro error covariance.

Various benefits and features of the present invention may become apparent from the following detailed description considered in conjunction with the accompanying drawings. It is to be understood, however, that the drawings are designed solely for purposes of illustration and not as a definition of the limits of the invention for which reference should be made to the appended claims.

BRIEF DESCRIPTION OF THE DRAWINGS

Further features of the invention, its nature and various advantages will be more apparent from the following detailed description of the embodiments, taken in conjunction with the accompanying drawings in which.

DETAILED DESCRIPTION OF EMBODIMENTS OF THE INVENTION

Navigation operations in vehicles require the use of heading and reference systems in order to obtain heading with respect to magnetic north and other navigation parameters. These systems are typically viewed as triaxial sensor systems that include gyroscopes, accelerometers and magnetometers and are capable of providing real-time orientation and direction information. As a result, these systems need to be reliable and accurate. However, the sensors commonly employed in the heading and reference systems are susceptible to different types of errors. For example, accelerometers can be adversely affected by sudden movements of the vehicle while gyroscopes only provide acceptable short-time stability due to the presence of a gyro drift attributed mainly to the initialization of the sensor and the subsequent integration of the measurements, thus resulting in unreliable measurements that can prove potentially dangerous for the operation of the vehicle. Furthermore, magnetometers are also susceptible to erroneous magnetic field measurements due to local magnetic disturbances. For example, the presence of ferrous materials (e.g., natural magnets) can cause constant hard iron disturbances that need to be accounted for during magnetometer readings. In addition, the presence of static and/or portable electrical circuits within the vehicle causes localized changes in the electromagnetic field which are reflected in the measurements of the magnetometers installed in the vicinity of the electrical circuits as soft iron disturbances. Such soft-iron disturbances can be dynamically changing and are of a non-linear nature. As a result, the magnetometers need to be periodically monitored and assessed for the presence of soft iron disturbances and subsequently calibrated in order to provide accurate heading measurements.

Accordingly, systems and methods are provided for periodically correcting for the effects of local soft iron on magnetic heading calculations in heading reference systems by detecting changes in both the magnetometer readings due to the presence of any soft iron magnetic disturbances and the gyro heading relative to magnetic north during a detection period. If the changes exceed a pre-defined threshold associated with an expected gyro drift the magnetometers are calibrated based on the gyro measurements.

Furthermore, the provided systems and methods can be employed in multiple installations of heading and reference systems (e.g., two or more) at different locations within a vehicle in order to identify localized soft-iron disturbances by measuring changes in the magnetic field during a detection period and subsequently detecting the heading and reference system responsible for exhibiting erroneous measurements and calibrating its internal magnetometers.

The following describes embodiments of the present invention in more detail with reference to the accompanying figures. For example, the discussion below describes techniques using a single heading and reference system for correcting for the effects of soft iron on the magnetometers based on magnetic heading differences associated with a gyro drift with reference to FIGS. 1-3. Thereafter, the discussion describes techniques, with reference to FIGS. 3-6, using dual installations of heading and reference systems for identifying and correcting localized soft-iron disturbances on the magnetometers that may use differences associated with a gyro drift.

Figure 1:
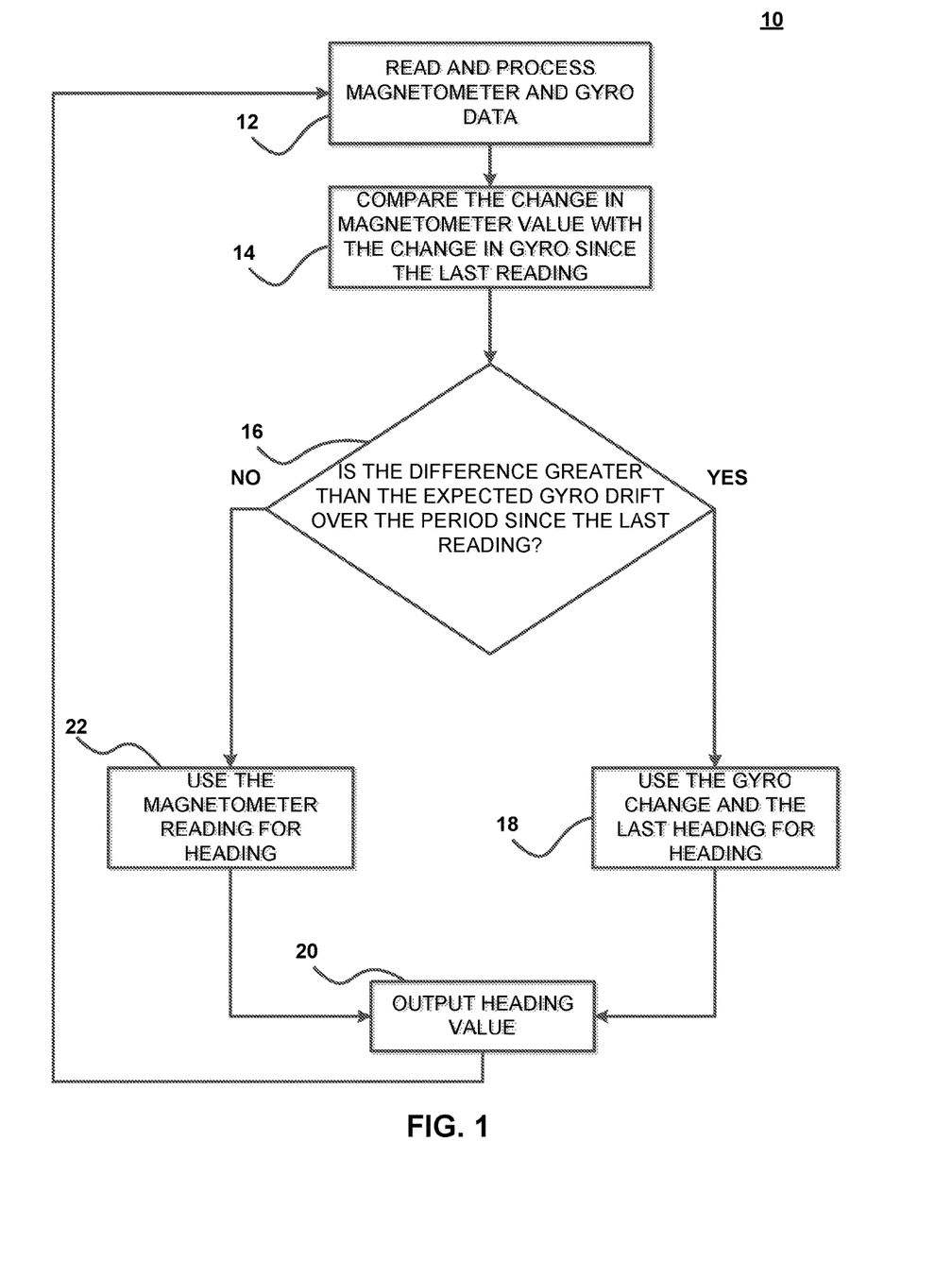
FIG. 1 is a flow chart in accordance with the method of the present invention which may be implemented in a heading reference system subject to soft iron magnetic disturbances.
Figure 2:
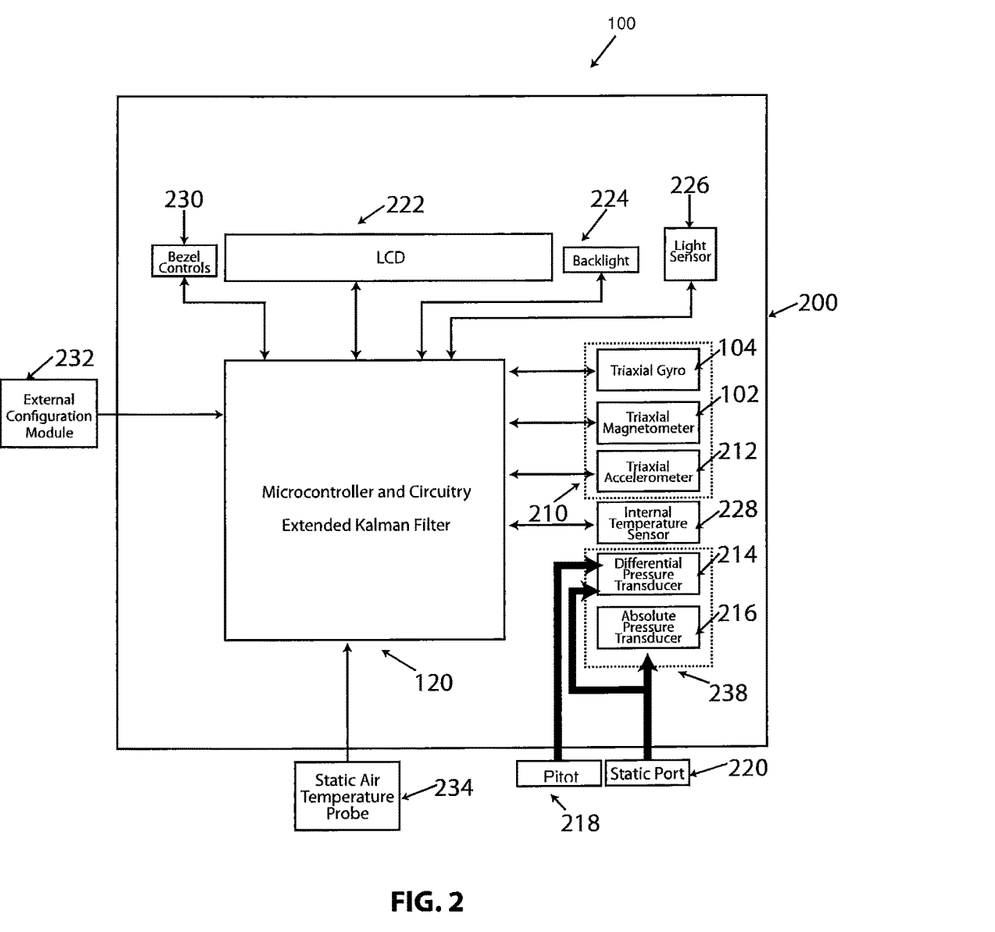
FIG. 2 is a block diagram of a typical heading reference system, such as an improved integrated standby system employing a heading reference system, implementing the method of the present invention illustrated in FIG. 1.

Referring now to the drawings in detail, and initially to FIG. 1, a flow chart is shown which illustrates the presently preferred compensation method of the present invention for minimizing the effects of soft iron magnetic disturbances in a heading reference system, such as the system 100 illustrated in FIG. 2. As will be described in greater detail hereinafter, the presently preferred compensation method of the present invention may be conventionally implemented in firmware or software housed in the conventional heading reference system 100 of the instrument, such as the integrated standby unit 200 illustrated in FIG. 2. The implementation of the compensation method of the present invention in firmware or software may readily be accomplished by one of ordinary skill in the art once the presently preferred compensation method of the present invention is understood from reference to the following description of this method below.

As shown and preferred, FIG. 1 diagrammatically illustrates a flow chart in accordance with the presently preferred compensation method of the present invention depicted as an iterative control loop 10 for repetitively compensating for any defined significant changes in the accuracy of a heading system 100 due to soft iron magnetic disturbances, such as can occur from local electric circuits adjacent to the heading reference system 100. This is preferably accomplished, as will be described in greater detail hereinafter, from a comparison of the change in the reading of the magnetometer, illustrated as a triaxial magnetometer 102 in FIG. 2, associated with the heading reference system 100, with the reading of the heading reference system gyro, illustrated as a triaxial gyro 104 in FIG. 2, against an expected gyro drift over that measurement period since the prior reading.

As illustrated in FIG. 1, the steps involved in iteratively carrying out the presently preferred compensation method of the present invention are as follows. The output data from both the magnetometer 102 and the gyro 104 are read and processed to provide signals corresponding to any change in the value of the magnetometer 102 reading and the gyro 104 reading. This step is represented by block 12 in FIG. 1. These signals are then compared to determine the actual changes in these values against each other since the previous reading. This step is represented by block 14 in FIG. 1. A determination is then made if any detected difference in value from the previous reading exceeds a predetermined acceptable threshold value which, in accordance with the present invention, is preferably defined as the expected gyro drift over the period since the prior reading. This step is represented in FIG. 1 by block 16. If as a result of this comparison the difference exceeds the expected gyro drift or acceptable threshold value, then, in accordance with the presently preferred compensation method of the present invention a corrected heading signal is provided which corresponds to the actual gyro change plus the last heading and this corrected heading signal is output to the heading reference system 100 to adjust the gyro heading to maintain accuracy. These steps are represented in FIG. 1 by blocks 18 and 20. On the other hand, if this detected difference does not exceed the predetermined acceptable threshold value, in other words, it is not greater than the expected gyro drift over this period, then the detected magnetometer 102 reading is used to provide the heading value for the gyro 104. These steps are represented by blocks 22 and 20 in FIG. 1. As previously mentioned, and as illustrated in the flow chart of FIG. 1, these steps continue to be iteratively periodically repeated in order to continue to maintain an accurate heading for the heading reference system 100 in the face of soft iron magnetic disturbances throughout the operation of the heading reference system 100.

The above described flow chart illustrated in FIG. 1 may be represented by the following algorithm:

In the case where:

k is a positive constant derived from expected gyro drift over the period $\Delta t$;

$\Delta MH$ is the change in magnetometer derived heading over the period $\Delta t$;

$\Delta GH$ is the change in gyro derived heading over the period $\Delta t$;

GH is the gyro derived heading at a specific time;

MH is the magnetometer derived heading at a specific time;

$\Delta H = |\Delta MH - \Delta GH|$;

Heading = $fn(GH, MH)$ for $\Delta H \leq k$; and

Heading = $GH$ and $MH = MH + \Delta H$ for $\Delta H > k$.

As described above, this algorithm can be readily implemented in firmware or software, such as employed in the microprocessor 120 of the heading reference system 100, such as a Freescale microprocessor conventionally programmed in C. As noted above, the algorithm relies on the periodic correction of the heading gyro 104 only when the difference between the magnetometer 102 reading and the gyro 104 measurements is in the order of the expected gyro drift over the period since the last correction was made to the gyro 104.

Summarizing the above described compensation method, preferably the magnetometer data is read for each axis as well as the gyro data for each axis. The gyro data is converted from body to inertial coordinates. The rate of change of heading based on the magnetometer readings over time is determined. The rate of change of heading is compared with the inertial coordinate rate of change of yaw from the gyros. Then, in accordance with the method of the present invention, the algorithm records the difference in rates of change if this difference is greater than a predetermined threshold value and uses it as a bias to correct for the soft iron impact on the magnetometer. On the other hand, if this difference is not greater than the predetermined threshold value, the algorithm uses the actual magnetometer value to correct for the drift in the gyros.

In accordance with the presently preferred compensation method of the present invention, a conventional extended Kalman filter (not shown) may also be employed in order to blend the gyro 104 measurement with the magnetometer 102 measurement, with the aforementioned difference between the magnetometer 102 and the gyro 104 being the gyro error covariance.

The above method can be employed in any magnetic heading indication system in which disturbances due to the presence of local soft iron can result in errors in magnetic heading calculations. In such an instance, by placing a gyro in the heading measurement axis and comparing the magnitude of the change in the magnetometer against the change in the gyro, any significant changes in the output of the magnetometer that is due to local magnetic field changes can be detected and corrected. Thus, the compensation method of the present invention may be employed not only in aircraft heading reference systems, such as in the integrated standby unit 200 illustrated in FIG. 2, to be described in greater detail hereinafter, but in other aircraft instruments such as primary or secondary attitude and heading reference systems, air data and attitude heading reference systems, or inertial navigation systems; as well as in non-aircraft systems such as vehicle or inertial systems that require a source of heading that may be subject to variations as a result of local electric field changes.

Referring now to FIG. 2, an example of a presently preferred integrated standby unit 200 is shown which has been enhanced and improved by implementing the previously described compensation method of the present invention. As shown and preferred in FIG. 2, the integrated standby unit 200 includes an inertial measurement unit 210 which includes triads of conventional accelerometers 212, gyros 104 and magnetometers 102, with the compensation method of the present invention being utilized with the gyros 104 and magnetometers 102 as described above. As shown and preferred, the integrated standby unit 200 may also include an integral air data measurement module 238 for conventional measurement of airspeed and altitude. The integrated standby unit 200 also preferably includes a conventional differential pressure transducer 214 and conventional absolute pressure transducer 216 fed by pitot 218 and a static port 220 as shown. In addition, the standby unit 200 also preferably includes a conventional LCD display 222, backlight 224, light sensor 226, internal temperature sensor 228, and bezel controls 230. As further shown and preferred in FIG. 2, the microprocessor 120 receives external inputs from an external configuration module 232 and a static air temperature probe 234.

Thus, the above integrated standby unit 200 illustrated in FIG. 2, comprises a series of temperature, pressure, magnetic, acceleration and rate sensors controlled by a microprocessor, such as a Freescale IMX series microprocessor, and presented on an LCD display. As such, the integrated standby system 200 provides for measurement, computation and display of flight critical information, including indicated and true airspeed, mach, static air temperature, altitude, pitch, roll, slip angle and magnetic heading. If desired, the integrated standby system 200 can be further augmented with GPS or other navigation sensors to also provide for display of course, wind and other navigational information.

In the system 200 illustrated in FIG. 2, the initial attitude and heading information is determined by means of the triaxial accelerometers 212 and magnetometers 102. At initialization, the vehicle or aircraft is assumed to be in zero acceleration state and, therefore, the combination of accelerometers 212 and magnetometers 102 provide an accurate initial state for pitch, roll and heading of the aircraft.

In the operational phase of the integrated standby unit 200, the triaxial rate sensors are preferably utilized to determine the current attitude and heading of the aircraft by monitoring and compensating for changes from the initial state. Computed angles based on rate sensor data normally suffer from a random drift, generally referred to as random walk. This drift is normally due to integration of the noise which is in the signal bandwidth and, thus, is not easily filtered by traditional signal conditioning algorithms. In order to compensate for this drift in the method of the present invention, the gyro outputs are periodically recalibrated against the magnetometer and accelerometer data. Variations of an extended Kalman filter are preferably used to periodically correct for the rate sensors drift as well as to blend all sensor data based on their corresponding error covariance. These blending and compensating algorithms provide for an accurate estimate of the aircraft attitude and heading. An example of such a blending algorithm is provided below:

$$\vec{i} = \frac{\vec{v_1}}{|\vec{v_1}|} \quad \vec{i_D} = \frac{\vec{B_D}}{|\vec{B_D}|} \quad \vec{i_E} = \frac{\vec{B_E}}{|\vec{B_E}|}$$

$$\vec{j} = \frac{\vec{v_1} \times \vec{v_2}}{|\vec{v_1}|} \quad \vec{j_D} = \frac{\vec{B_D} \times \vec{G_D}}{|\vec{B_D} \times \vec{G_D}|} \quad \vec{j_E} = \frac{\vec{B_E} \times \vec{G_E}}{|\vec{B_E} \times \vec{G_E}|}$$

$$\vec{k} = \vec{i} \times \vec{j} \quad \vec{k_D} = \vec{i_D} \times \vec{j_D} \quad \vec{k_E} = \vec{i_E} \times \vec{j_E}$$

$$R_{D \to 1} = \begin{bmatrix} i_{Dx} & j_{Dx} & k_{Dx} \\ i_{Dy} & j_{Dy} & k_{Dy} \\ i_{Dz} & j_{Dz} & k_{Dz} \end{bmatrix}$$

$$R_{E \to 1} = \begin{bmatrix} i_{Ex} & j_{Ex} & k_{Ex} \\ i_{Ey} & j_{Ey} & k_{Ey} \\ i_{Ez} & j_{Ez} & k_{Ez} \end{bmatrix}$$

$$R_{D \to E} = R_{D \to 1} \cdot R_{1 \to E}$$

$$\vec{v_D} \cdot R_{D \to E} = \vec{v_E}$$

A variation of the above algorithm can be used to update the attitude estimate utilizing a variation of a Kalman filter, such as illustrated below:

$$\tilde{x}_{k|k-1} = F_k \tilde{x}_{k-1|k-1} + B_k u_k$$

$$P_{k|k-1} = F_k P_{k-1|k-1} F_k^T + Q_k$$

$$\tilde{y}_k = z_k - H_k \tilde{x}_{k|k-1}$$

$$S_k = H_k P_{k|k-1} H_k^T + R_k$$

$$K_k = P_{k|k-1} H_k^T S_k^{-1}$$

$$\tilde{x}_{k|k} = \tilde{x}_{k|k-1} + K_k \tilde{y}_k$$

$$P_{k|k} = (I - K_k H_k) P_{k|k-1}$$

As is well known, the local magnetic environment which surrounds the standby unit 200 in a typical aircraft panel installation is subject to variations such as magnetic effects of power switching to a nearby instrument. At install time, the standby unit 200 would preferably be calibrated in its intended environment to compensate for the effects of the local environment. However, in the course of a typical flight, various equipment is normally turned on or off which could result in an error in the magnetic heading measured by the internal magnetometers. The method of the present invention enables the system to compensate for these errors, with the algorithm $\Delta H > k$ detecting their occurrence and compensating for the resultant error above a predetermined threshold value.

It will be appreciated by one of ordinary skill in the art that numerous compensation algorithms may be used for various systems without departing from the spirit and scope of the present invention. Thus, the compensation algorithm may range from a relatively simple algorithm that periodically compares the change in the magnetic heading as measured by the magnetometers against the change in heading measured by the rate sensors, such as illustrated in FIG. 1 and represented by the previously enumerated expression:

Heading=$fn(GH,MH)$ for $\Delta H = < k$

Figure 3:
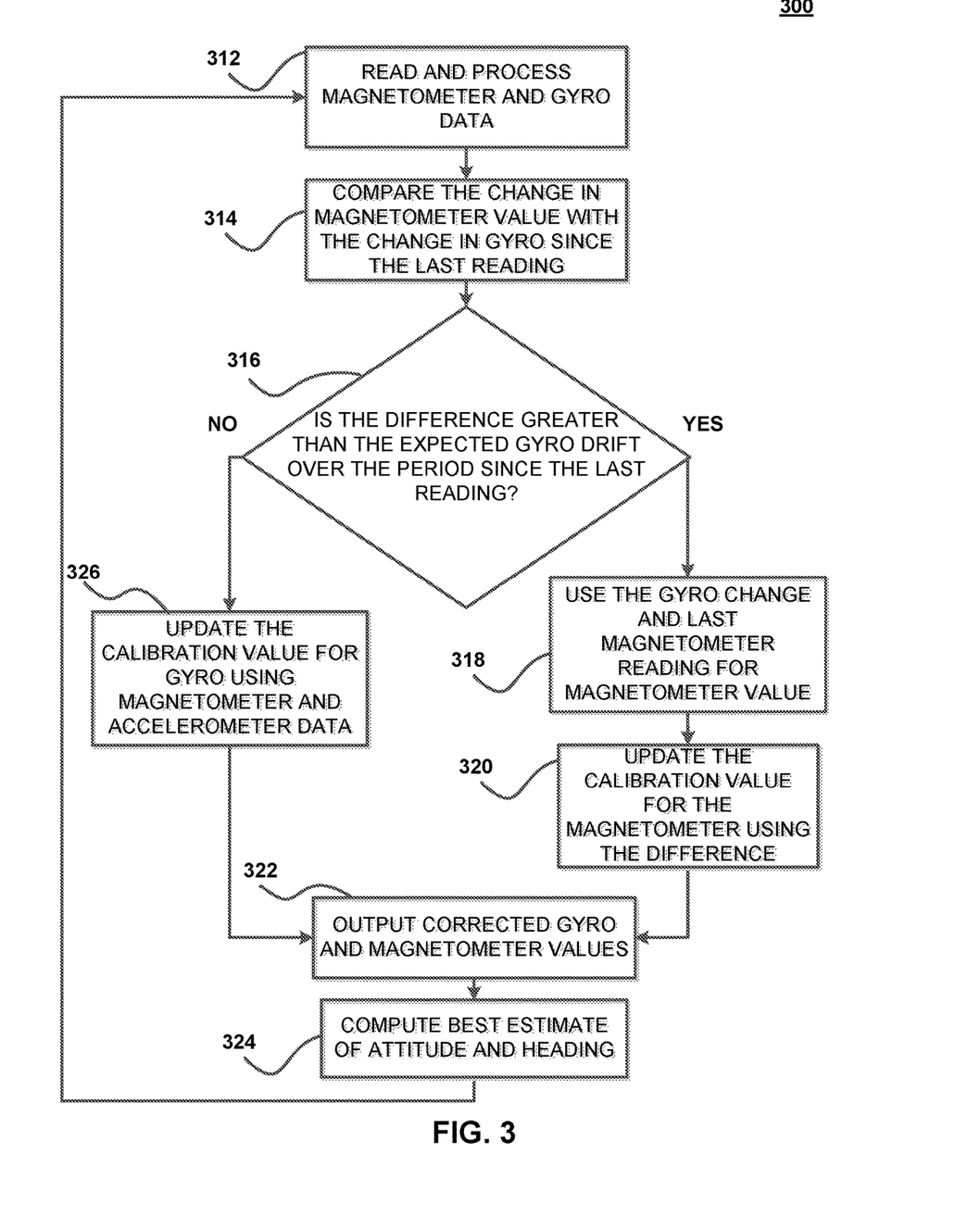
FIG. 3 is a flow chart, similar to FIG. 1, in accordance with the method of the present invention, which may, alternatively, be implemented in the heading reference system of FIG. 2 and may be implemented alternatively in the heading systems of FIG. 4.

Heading=$GH$ and $MH = MH + \Delta H$ for $\Delta H > k$ to more complex or elaborate schemes in which the rates of change of the magnetometers and rate sensors for each axis are compared, such as represented by the flow chart of FIG. 3 and the following expression:

In the case where:

XGI, YGI, ZGI represent change of angle in X, Y, Z axis as derived from gyros in inertial reference and XM, YM, ZM represent X, Y, Z magnetometer readings and XKI, YKI, ZKI represent maximum expected gyro angular rate drift in inertial reference:

$\Delta X$=|rate of change of $XGI$–rate of change of $XM$|

$\Delta Y$=|rate of change of $YGI$–rate of change of $YM$|

$\Delta Z$=|rate of change of $ZGI$–rate of change of $ZM$|

Pitch=$fn(YGI,$Accelerometer data,Magnetometer data)

Roll=$fn(XGI,$Accelerometer data,Magnetometer data)

Heading=$fn(ZGI,$Magnetometer data)

If $\Delta X > XKI, XM = XM + \Delta X \Delta t$

If $\Delta Y > YKI, YM = YM + \Delta Y \Delta t$

Typically, in accordance with the method of the present invention, if the change is greater than the expected drift error of the rate sensors, which is a predetermined threshold value, it is assumed that the magnetometer is being affected by a local change in magnetic field and the rate sensor data is used to compensate for the effects of the change in the local magnetic field.

Referring now to FIG. 3, FIG. 3 diagrammatically illustrates an alternative flow chart, similar to FIG. 1, in accordance with the compensation method of the present invention, that accomplishes the above described method which utilizes the complex scheme represented by the above algorithm. It will be apparent to one of ordinary skill in the art, that the steps of the method illustrated in FIG. 3 may be performed in different orders without departing from the spirit and scope of the present invention. Like with the flow chart illustrated in FIG. 1, the flow chart of FIG. 3 is illustrated as an iterative control loop 300 for repetitively compensating for any defined significant changes in the accuracy of the heading system due to soft iron magnetic disturbances. In carrying out this compensation method, the steps may comprise saving the current value of the magnetometer readings; subtracting the current value of the magnetometer readings from the previously saved magnetometer values; dividing the difference in magnetometer readings by the time period to obtain the rate of change; subtracting the determined magnetometer rate of change from the average rate sensor change for the time period; and, if the difference is less than or equal to the maximum expected drift of the rate sensor, using the magnetometer data to compensate for the rate sensor drift. However, if that is not the case, then the rate sensor data is used to compensate for the effect of soft iron on the magnetometer.

Alternatively, as referred to above, more elaborate schemes may be utilized in which the rates of change of the magnetometers and rate sensors for each axis are compared, such as in the system 200 illustrated in FIG. 2 employing a tri-axial gyro 104, tri-axial magnetometer 102, and tri-axial accelerometer 212. In such an instance, the compensation method of the present invention may comprise the steps of reading the magnetometer data for each axis; reading the gyro data for each axis; converting the gyro data from body to inertial coordinates; determining the rate of change of each magnetic axis based on the magnetometer readings over time; comparing the rate of change of each magnetic axis with the inertial coordinate rate of change of the gyro for the same axis; and, if the difference in rates of change is greater than a predetermined value, recording the difference and using it as a bias to correct for the soft iron impact on each axis of the magnetometer. However, if that is not the case, then the magnetometer values are used in the algorithm such as the Kalman filter algorithm described below which is as follows:

Predict $$\hat{x}_{k|k-1} = F_k \hat{x}_{k-1|k-1} + B_k u_k \quad \text{Predicted state estimate}$$

$$P_{k|k-1} = F_k P_{k-1|k-1} F_k^T + Q_k \quad \text{Predicted estimate covariance}$$

Update $$\tilde{y}_k = z_k - H_k \hat{x}_{k|k-1} \quad \text{Innovation}$$

$$S_k = H_k P_{k|k-1} H_k^T + R_k \quad \text{Innovation covariance}$$

$$K_k = P_{k|k-1} H_k^T S_k^{-1} \quad \text{Optimal Kalman gain}$$

$$\hat{x}_{k|k} = \hat{x}_{k|k-1} + K_k \tilde{y}_k \quad \text{Updated state estimate}$$

$$P_{k|k} = (I - K_k H_k) P_{k|k-1} \quad \text{Updated estimate covariance}$$

to correct for the drift in the gyros. Alternatively, the accelerometer data can be used in this algorithm to augment the magnetometer data during no acceleration modes such as un-accelerated straight and level motion of the vehicle or when the vehicle is stationary.

In the above situation, where the compensation method of the present invention is employed in connection with each axis, such as in the system 200 of FIG. 2, in which the compensation method compares and compensates for effects of soft iron on each of the magnetometers, an internal model of the expected magnetic readings for each magnetometer is developed that estimates the expected value of each magnetometer based on estimated heading, pitch and roll of the aircraft as determined by the gyros and accelerometers. This model is periodically updated by taking into account the magnetometer readings and, as such, the change in the estimated magnetometer readings is preferably compared with the change in the actual magnetometer reading for each axis and is used to compensate for the effects of soft iron on each magnetometer or to correct the drift on each gyro.

As illustrated in FIG. 3, the steps involved in iteratively carrying out the compensation method of the present invention may involve reading and processing the magnetometer 102, accelerometer 212, and gyro 104 data to provide signals corresponding to any change in magnetometer value and gyro value. This step is represented by block 312 in FIG. 3. These signals are then compared against each other to determine any actual change since the previous reading. This step is represented by block 314 in FIG. 3. A determination is then made if any detected difference in value from the previous reading is greater than the expected gyro drift over the period since the previous reading. This step is represented by block 316 in FIG. 3. If as a result of this comparison the difference exceeds the expected gyro drift, then, in accordance with the compensation method illustrated in FIG. 3, the gyro change plus the last magnetometer reading is used for the magnetometer value, represented by block 318 in FIG. 3, and the calibration value for the magnetometer is updated using the difference, represented by block 320 in FIG. 3. The corrected gyro and magnetometer values are then output, represented by block 322 in FIG. 3, and the best estimate of attitude and heading is computed, represented by block 324 in FIG. 3, and the steps are iteratively periodically repeated, as illustrated in FIG. 3. On the other hand, if the detected difference is less than the expected gyro drift over the period since the previous reading, the calibration value for the gyro is updated using the magnetometer and the accelerometer data. This step is represented by block 326 in FIG. 3, and then the corrected gyro and magnetometer values are output, as represented by block 322, the best estimate of attitude and heading is computed, represented by block 324, and the process is iteratively periodically repeated.

Figure 4:
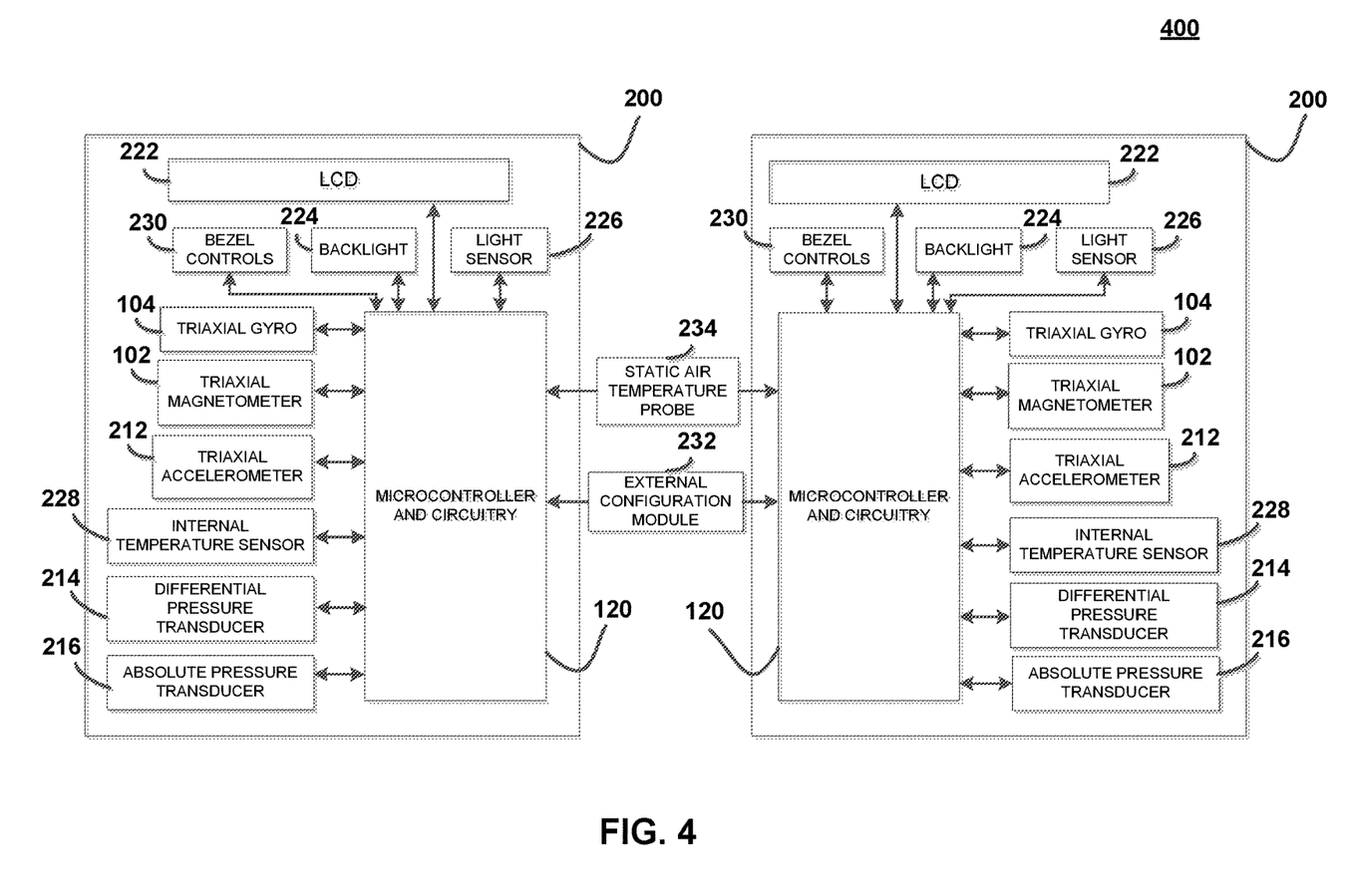
FIG. 4 is a block diagram of a vehicle navigation system including two integrated standby systems employing respective heading reference systems in accordance with some embodiments of the present invention.

Referring now to FIG. 4, an example of system 400 for correcting for the effects of soft iron disturbances in a dual heading and reference system installation is shown. System 400 includes two heading and reference systems such as integrated standby units 200 that are installed at different locations within the vehicle as previously illustrated and discussed in reference to FIG. 2. Each heading and reference system 200 includes triads of sensors (e.g., conventional accelerometers 212, gyros 104 and magnetometers 102) that are utilized for measuring magnetic heading and other parameters required for the navigation of a vehicle. In some embodiments, a heading and reference system can be any suitable navigation system that includes a triad of sensors such as an attitude and heading reference system, integrated standby unit, a primary and/or secondary vehicle inertial unit and/or any portable system that can be placed inside or outside a vehicle and is capable of measuring navigation parameters.

System 400 can include two or more integrated standby units 200 where each of them preferably includes a conventional differential pressure transducer 214 and conventional absolute pressure transducer 216 for conventional measurement of airspeed and altitude. In addition, standby unit 200 also preferably includes a conventional LCD display 222, backlight 224, light sensor 226, internal temperature sensor 228, and bezel controls 230. As further shown in FIG. 4, each of the integrated standby units includes microcontroller 120 that receives external inputs from an external configuration module 232 and a static air temperature probe 234.

Thus, each of the above integrated standby units 200 illustrated in FIG. 4, comprises a series of temperature, pressure, magnetic, acceleration and rate sensors controlled by a microcontroller and/or microprocessor, such as a Freescale IMX series microprocessor, and presented on an LCD display. As such, the integrated standby unit 200 provides for measurement, computation and display of flight critical information, including indicated and true airspeed, mach, static air temperature, altitude, pitch, roll, slip angle and magnetic heading. If desired, the integrated standby unit 200 can be further augmented with GPS or other navigation sensors to also provide for display of course, wind and other navigational information. Furthermore, system 400 can include any combination of heading reference units such as standby unit 200 combined with an inertial navigation unit, two inertial navigation units and/or any suitable combination thereof.

In system 400, illustrated in FIG. 4, the initial attitude and heading information is determined by means of the tri-axial accelerometers 212 and magnetometers 102 in both standby units 200. At initialization, the vehicle or aircraft is assumed to be in zero acceleration state and, therefore, the combination of accelerometers 212 and magnetometers 102 provide an accurate initial state for pitch, roll and heading of the aircraft.

In the operational phase of each of the integrated standby units 200, the tri-axial rate sensors are preferably utilized to determine the current attitude and heading of the aircraft by monitoring and compensating for changes from the initial state. Computed angles based on rate sensor data normally suffer from a random drift, generally referred to as random walk. This drift is attributed to the integration of noise which is in the signal bandwidth and, thus, is not easily filtered by traditional signal conditioning algorithms. In order to compensate for this drift the gyro outputs are periodically recalibrated against the magnetometer and accelerometer data. Variations of an extended Kalman filter are preferably used to periodically correct for the rate sensors drift as well as to blend all sensor data based on their corresponding error covariance. These blending and compensating algorithms provide for an accurate estimate of the aircraft attitude and heading and were previously discussed in reference to FIG. 2.

Furthermore, the internal magnetometers of standby units 200 also suffer from disturbances that result to unreliable measurements. Specifically, the local magnetic environment which surrounds each of the standby units 200 that are installed at different locations within the aircraft, is subject to variations such as magnetic effects of power switching to a nearby instrument and/or the presence of other, external electronic circuits that may be present in the vehicle (e.g., smartphones, computers etc.). These types of soft iron disturbances affecting the magnetometers are initially compensated for at install time, whereby each of the standby units 200 is calibrated to compensate for the effects of the local environment. Subsequently, a periodic calibration is necessary during the course of a typical flight, since various equipment is normally turned on or off which could result in an error in the magnetic heading measured by the internal magnetometers.

Moreover, it will be appreciated by one of ordinary skill in the art that with respect to the dual heading and reference system installation of system 400 numerous compensation techniques may be used for various systems without departing from the spirit and scope of the present invention. Specifically, system 400 also allows for an initial detection of the existence of localized soft iron disturbances by comparing the changes of the local magnetic field as measured by the magnetometers of the respective standby units 200. As a result, the computational and storage requirements that are associated with the periodic calculation of the navigation parameters and subsequent calibration of the sensors can be minimized by dynamically determining when to perform a calibration process that can be similar to the techniques described in FIGS. 1 and 3.

Figure 5:
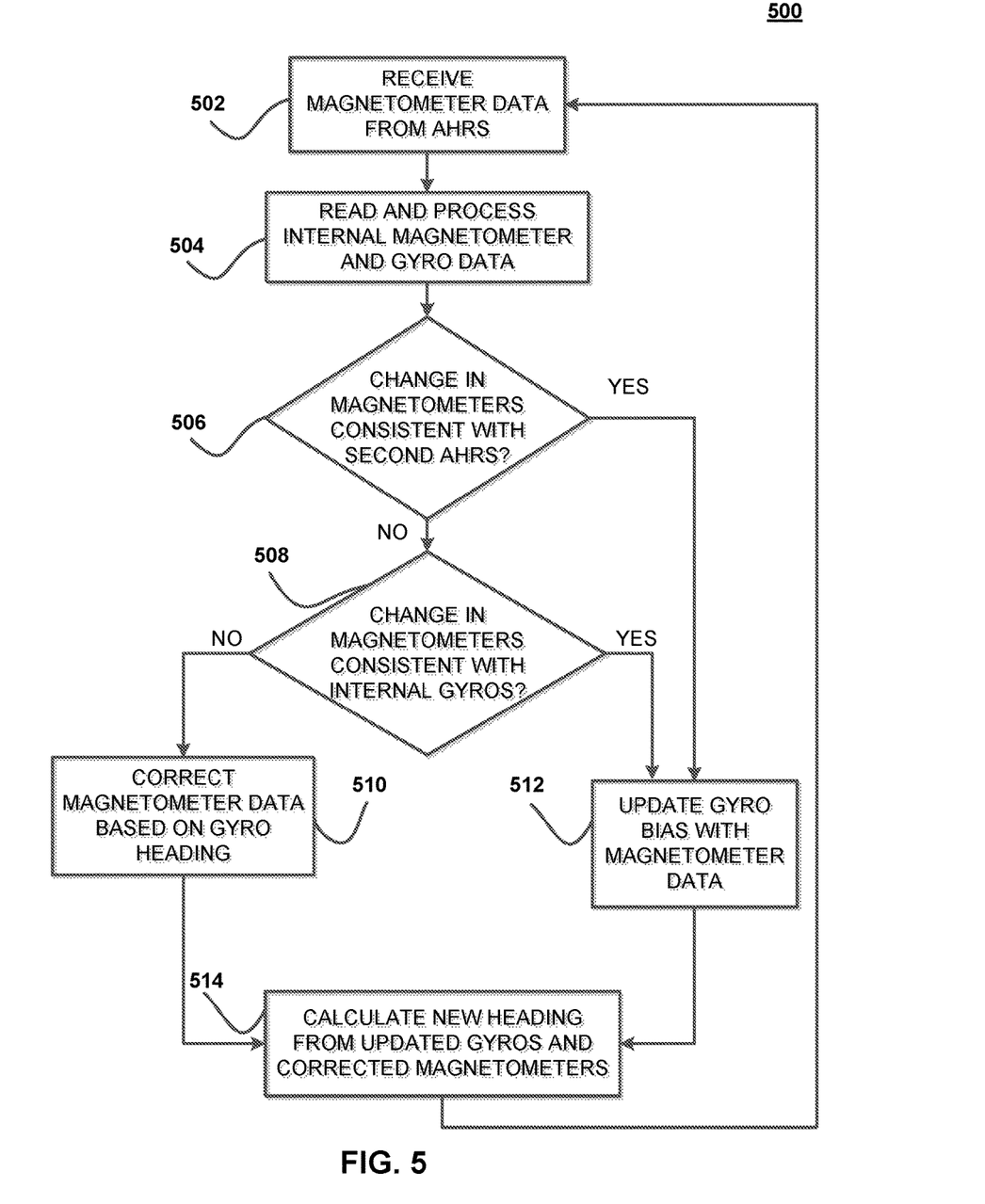
FIG. 5 is a flow chart illustrating a process for correcting for the effects of soft iron in magnetometers given a dual installation of heading and reference systems of FIG. 4 in accordance with some embodiments of the present invention.

Referring now to FIG. 5, a flow chart showing method 500 for iteratively correcting for soft iron disturbances in a dual AHRS installation similar to the one referenced in FIG. 4 is provided. Specifically, at 502 one and/or both of the standby units 200 exchange the magnetometer 102, accelerometer 212, and gyro 104 sensor data as measured at the different installation locations within the vehicle. At 504, the sensor data related to internal magnetometers 102 and gyros 104 are read and processed to provide signals corresponding to any change in the magnetometer readings from the immediately previous obtained reading based on a detection period $\Delta t$.

The magnetometer change signal obtained from each of the standby units 200 reflects any deviation of the intensity and direction of the magnetic field as measured by the internal magnetometers during the detection period. At 506 a determination is made to ascertain if the magnetometer change signals from each of the standby units 200 are consistent with each other. This can be accomplished by computing a difference of the change signals and if that difference does not exceed a pre-determined threshold (e.g., "YES" at 506) then no indication of local soft iron magnetic disturbances has been detected in the internal magnetometers of each of standby units 200. As a result, at 512, the internal magnetometers of standby units 200 can be used to correct the gyro measurements by updating the gyro drift and subsequently calibrating the gyro sensors using the updated gyro drift. For example, such calibration can be accomplished by using the magnetometer readings to provide a heading value that can be used to update the gyro drift during the detection period and subsequently be subtracted by the gyro measurements. Thus, a new heading can be calculated at 514 using the calibrated gyro measurements and the magnetometers.

Moreover, detecting an indication of soft iron magnetic disturbances in two or more installations of heading and reference systems may be represented by the following algorithm:

th is an acceptable positive constant derived from expected magnetic values of the local magnetic field;

$\Delta M_1$ is the change in the magnetometer reading associated with the first heading and reference system during detection period $\Delta t$;

ΔM₂ is the change in the magnetometer reading associated with the second heading and reference system during detection period Δt;

An indication of soft iron disturbances is detected if |ΔM₁−ΔM₂|>th.

In some embodiments, the acceptable threshold may be determined using theoretical magnetic field values obtained from a model of the Earth's magnetic field. For example, such information can be obtained from a website or any other suitable source and/or database that provides information relating to the Earth's magnetic field. In some embodiments, the theoretical magnetic field values can be stored in a memory element included in microprocessor 120 of standby unit 200 and accessed during the detection period in order to identify and perform the compensation techniques described herein.

If, however, the difference of the magnetometer change signals from each of the standby units 200 does exceed a pre-defined threshold, indicating that the change of measurements of the internal magnetometers among the two heading and reference systems is not consistent (e.g., "NO" at 506) then a subsequent determination is needed at 508 to detect the heading and reference system that is possibly exposed to soft iron magnetic disturbances and identify its location within the vehicle. Such a determination is accomplished by computing for each standby unit 200 a pair of expected heading values using their respective internal magnetometers and the gyros and computing a difference (e.g., a change signal) between the expected heading as measured by the magnetometers and the gyros for each standby unit 200. If the difference does not exceed a pre-defined threshold, thus indicating that the change in the expected heading as measured by the magnetometers and gyros is consistent (e.g., "YES" at 508) across standby units 200 then method 500 proceeds to 512 and uses the internal magnetometers of standby units 200 to correct the gyro measurements by updating the gyro drift and subsequently calibrating the gyro sensors using the updated gyro drift. A new heading can be then calculated at 514 using the calibrated gyro measurements and the magnetometers.

If, however, the difference does exceed a pre-defined threshold, thus indicating that the change in the expected heading as measured by the magnetometers and gyros is not consistent across standby units 200 (e.g., "YES" at 508), then the standby unit exhibiting the largest deviation from the pre-defined threshold is identified as being susceptible to soft iron disturbances thereby requiring calibration of the magnetometers. This can be accomplished at 510 by calibrating the magnetometer data using the heading measurement obtained by the gyroscopes. In some embodiments, a magnetometer calibration value can be computed using the difference of an immediately previous heading measurement obtained from the magnetometers and the current heading as computed from the gyros. In some embodiments, the computed gyro heading can be obtained from either of the standby units and/or as a combination (e.g., average) from both standby units 200.

In some embodiments, a conventional extended Kalman filter as discussed above in reference with FIG. 2 may also be employed in order to blend the gyro 104 measurements with the magnetometer 102 measurements, with the aforementioned difference between the magnetometers 102 and the gyros 104 that is computed at 508 being dependent on the gyro error covariance.

Figure 6:
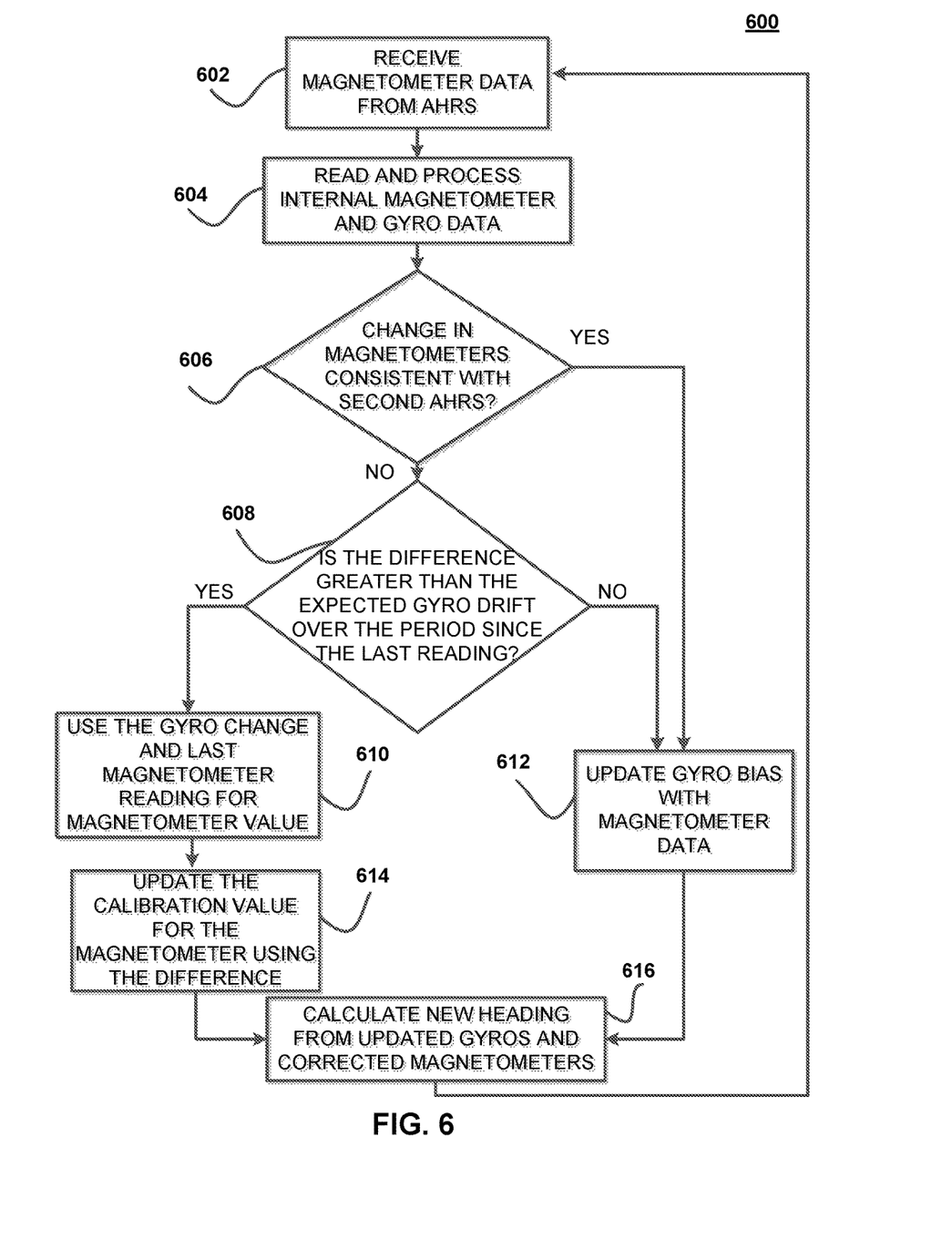
FIG. 6 is a flow chart illustrating a process for correcting for the effects of soft iron in magnetometers and calibrating magnetometers given a dual installation of heading and reference systems of FIG. 4 in accordance with some embodiments of the present invention.

FIG. 6 illustrates a flow chart of method 600 for iteratively correcting for soft iron disturbances in magnetometers in a dual heading and reference system installation, as illustrated in FIG. 4, using data associated with the expected gyro drift as previously discussed in reference to FIGS. 1 and 5.

Specifically, at 602 one and/or more of standby units 200 exchange/receive the magnetometer 102, accelerometer 212, and gyro 104 sensor data as measured at the different installation locations within the vehicle. At 604, the sensor data related to internal magnetometers 102 and gyros 104 are read and processed to provide signals corresponding to any change in the magnetometer readings from the immediately previous obtained reading during a detection period Δt. The magnetometer readings provide the intensity and direction of the magnetic field and their computed difference during the detection period reflects any deviation of the local magnetic field.

At 606 a determination is made to ascertain whether the magnetometer change signals derived from the two standby units 200 are consistent by computing, for example, a difference of the change signals and if that difference does not exceed a pre-determined threshold (e.g., "YES" at 606) then no local soft iron magnetic disturbances have been detected in the internal magnetometers of each of the standby units 200. As a result, at 612, the internal magnetometers of standby units 200 can be used to correct the gyro measurements by updating the gyro drift and subsequently calibrating the gyro sensors using the updated gyro drift. In some embodiments, such calibration can be accomplished by using the magnetometer readings to provide a heading value that can be used to update the gyro drift during the detection period and subsequently be subtracted from the gyro measurements. Thus, a new heading can be calculated at 616 using the calibrated gyro measurements and the magnetometers.

If, however, the difference of the magnetometer change signals from each of the standby units 200 does exceed a pre-defined threshold, indicating that the change of measurements of the internal magnetometers among the two heading and reference systems is not consistent (e.g., "NO" at 606) then a subsequent determination is needed at 608 to detect the level of deviation that can be attributed to soft iron magnetic disturbances for one or both of the heading and reference systems. Such a determination is accomplished by detecting whether the difference in value from the previous reading exceeds a pre-determined acceptable threshold value that is defined as the expected gyro drift over the period since the last reading for each standby unit 200. If the difference does not exceed the expected gyro drift during the detection period (e.g., "YES" at 608) across standby units 200 then method 600 proceeds to 612 and uses the internal magnetometers of standby units 200 to correct the gyro measurements by updating the gyro drift and subsequently calibrating the gyro sensors using the updated gyro drift. A new heading can be then calculated at 614 using the calibrated gyro measurements and the magnetometers.

If, however, the difference does exceed the expected gyro drift for one or both standby units 200 (e.g., "YES" at 608), then the standby unit exhibiting the largest deviation from the expected gyro drift is identified as being susceptible to soft iron disturbances thereby requiring calibration of the magnetometers. In some embodiments, both standby units 200 may be considered as being affected from soft iron disturbances, thus requiring calibration that can be achieved either in parallel (e.g., simultaneous calibration) and/or sequentially. This can be accomplished at 610 by using the gyro change plus the last magnetometer reading for the magnetometer value and updating, at 614, the calibration value for the magnetometer using the difference. The corrected gyro and magnetometer values are then used to calculate the best estimate of attitude and heading, as shown at 616, and the steps are iteratively periodically repeated. Such compensation techniques can range from simple to complex as were previously discussed in reference to FIGS. 1-2.

In some embodiments, a conventional extended Kalman filter as discussed above in reference with FIG. 2 may also be employed in order to blend the gyro 104 measurements with the magnetometer 102 measurements, with the aforementioned difference between the magnetometers 102 and the gyros 104 that is computed at 508 being dependent on the gyro error covariance.

While there have been shown and described various novel features of the invention as applied to particular embodiments thereof, it should be understood that various omissions and substitutions and changes in the form and details of the systems and methods described and illustrated may be made by those skilled in the art without departing from the spirit and scope of the invention. Those skilled in the art will recognize, based on the above disclosure and an understanding therefrom of the teachings of the invention, that the general structure and functionality provided by and incorporated therein, may vary in different embodiments of the invention. Accordingly, the particular systems and methods shown in FIG. 1-FIG. 6 are for illustrative purposes to facilitate a full and complete understanding and appreciation of the various aspects and functionality of particular embodiments of the invention as realized in system and method embodiments thereof. Those skilled in the art will appreciate that the invention can be practiced in other than the described embodiments, which are presented for purposes of illustration and not limitation, and the present invention is limited only by the claims which follow.

What is claimed is:

1. A system for compensating for soft iron magnetic disturbances in a heading reference system of a vehicle, the system comprising:
a first magnetometer;
a second magnetometer located at a different location on the vehicle from the first magnetometer;
a first heading gyro coupled to the first magnetometer;
a second heading gyro coupled to the second magnetometer; and
a processor configured to:
receive magnetometer data from the first magnetometer;
receive magnetometer data from the second magnetometer;
determine whether one of the first or second magnetometers is potentially soft iron disturbed using the magnetometer data received from the first and second magnetometers and a magnetometer error threshold; and
in response to determining that one of the first or second magnetometers is potentially soft iron disturbed, determine which of the first or second magnetometers is potentially soft iron disturbed using the first and second heading gyros, a first threshold based on an expected drift of the first heading gyro, and a second threshold based on an expected drift of the second heading gyro.

2. The system of claim 1, wherein the magnetometer error threshold is based on theoretical magnetic field values obtained from a model of the Earth's magnetic field.

3. The system of claim 1, wherein in order to determine whether one of the first or second magnetometers is potentially soft iron disturbed, the processor is configured to:
generate a first value and a second value indicating a change of a magnetic field during a detection period based on data received from the first magnetometer and the second magnetometer, respectively;
determine a difference of change of the magnetic field between the first value based on the first magnetometer and the second value based on the second magnetometer; and
determine that a magnitude of the difference of change of the magnetic field exceeds the magnetometer error threshold.

4. The system of claim 1, wherein in response to determining that neither of the first or second magnetometer is potentially soft iron disturbed, the processor is configured to:
use magnetometer data received from the first magnetometer to provide a first heading value to calibrate the first heading gyro; and
use magnetometer data received from the second magnetometer to provide a second heading value to calibrate the second heading gyro.

5. The system of claim 1, wherein in order to determine which of the first or second magnetometers is potentially soft iron disturbed, the processor is configured to:
generate a first pair of heading values utilizing the first magnetometer and the first heading gyro, and a second pair of heading values utilizing the second magnetometer and the second heading gyro;
generate a first heading error value based on the first pair of heading values and a second heading error value based on the second pair of heading values; and
compare the first heading error value to the first threshold and the second heading error value to the second threshold.

6. The system of claim 5, wherein:
in response to determining that the first heading error value exceeds the first threshold, the processor is configured to use a gyro reading from the first heading gyro to calibrate the first magnetometer; and
in response to determining that the second heading error value exceeds the second threshold, the processor is configured to use a gyro reading from the second heading gyro to calibrate the second magnetometer.

7. The system of claim 5, wherein
in response to determining that the first heading error value does not exceed the first threshold, the processor is configured to use magnetometer data received from the first magnetometer to provide a first heading value to calibrate the first heading gyro; and
in response to determining that the second heading error value does not exceed the second threshold, the processor is configured to use magnetometer data received from the second magnetometer to provide a second heading value to calibrate the second heading gyro.

8. The system of claim 1, wherein the first magnetometer and the second magnetometer are tri-axial magnetometers and the first heading gyro and the second heading gyro are tri-axial gyroscopes.

9. The system of claim 1, wherein the heading reference system is an aircraft heading reference system.

10. The system of claim 1, wherein the heading reference system is an integrated standby unit.

11. The system of claim 1, wherein the heading reference system is an attitude and heading reference system.

12. The system of claim 1, wherein the heading reference system is an inertial navigation system.

13. The system of claim 1, wherein the first magnetometer and the first heading gyro are included in a first heading reference system and the second magnetometer and second heading gyro are included in a second heading reference system.

14. A method for compensating for soft iron magnetic disturbances in a heading reference system of a vehicle, the method comprising:
  receiving magnetometer data from a first magnetometer;
  receiving magnetometer data from a second magnetometer, wherein the second magnetometer is at a different location on the vehicle from the first magnetometer;
  determining whether one of the first or second magnetometers is potentially soft iron disturbed using the magnetometer data received from the first and second magnetometers and a magnetometer error threshold; and
  in response to determining that one of the first or second magnetometers is potentially soft iron disturbed, determining which of the first or second magnetometers is potentially soft iron disturbed by using: a first heading gyro associated with the first magnetometer and a second heading gyro associated with the second magnetometer, a first threshold based on an expected drift of the first heading gyro, and a second threshold based on an expected drift of the second heading gyro.

15. The method of claim 14, wherein the magnetometer error threshold is based on theoretical magnetic field values obtained from a model of the Earth's magnetic field.

16. The method of claim 14, wherein determining whether one of the first or second magnetometers is potentially soft iron disturbed further comprises:
  generating a first value and a second value indicating a change of a magnetic field during a detection period based on data received from the first magnetometer and the second magnetometer, respectively;
  determining a difference of change of the magnetic field between the first value based on the first magnetometer and the second value based on the second magnetometer; and
  determining that a magnitude of the difference of change of the magnetic field exceeds the magnetometer error threshold.

17. The method of claim 14 further comprising:
  in response to determining that neither of the first or second magnetometer is potentially soft iron disturbed,
  using magnetometer data received from the first magnetometer to provide a first heading value to calibrate the first heading gyro associated with the first magnetometer; and
  using magnetometer data received from the second magnetometer to provide a second heading value to calibrate the second heading gyro associated with the second magnetometer.

18. The method of claim 14, wherein determining which of the first or second magnetometers is potentially soft iron disturbed further comprises:
  generating a first pair of heading values utilizing the first magnetometer and the first heading gyro, and a second pair of heading values utilizing the second magnetometer and the second heading gyro;
  generating a first heading error value based on the first pair of heading values and a second heading error value based on the second pair of heading values; and
  comparing the first heading error value to the first threshold and the second heading error value to the second threshold.

19. The method of claim 18 further comprising:
  in response to determining that the first heading error value exceeds the first threshold, using a gyro reading from the first heading gyro to calibrate the first magnetometer associated with the first heading gyro; and
  in response to determining that the second heading error value exceeds the second threshold, using a gyro reading from the second heading gyro to calibrate the second magnetometer associated with the second heading gyro.

20. The method of claim 18 further comprising:
  in response to determining that the first heading error value does not exceed the first threshold, using magnetometer data received from the first magnetometer to provide a first heading value to calibrate the first heading gyro associated with the first magnetometer; and
  in response to determining that the second heading error value does not exceed the second threshold, using magnetometer data received from the second magnetometer to provide a second heading value to calibrate the second heading gyro associated with the second magnetometer.

* * * * *